(12) United States Patent
Tsai et al.

(10) Patent No.: US 8,669,896 B2
(45) Date of Patent: Mar. 11, 2014

(54) SUCCESSIVE-APPROXIMATION-REGISTER ANALOG-TO-DIGITAL CONVERTOR AND RELATED CONTROLLING METHOD

(75) Inventors: Jen-Che Tsai, Taichung (TW); Chao-Hsin Lu, Hsinchu County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/493,999

(22) Filed: Jun. 11, 2012

(65) Prior Publication Data

US 2013/0099953 A1  Apr. 25, 2013

Related U.S. Application Data

(60) Provisional application No. 61/551,027, filed on Oct. 25, 2011.

(51) Int. Cl.
*H03M 1/38* (2006.01)

(52) U.S. Cl.
USPC ............... 341/161; 377/70; 377/75; 377/76; 370/295; 370/296; 341/155; 341/158; 341/160

(58) Field of Classification Search
USPC ................. 341/150–170; 377/70, 75, 76
See application file for complete search history.

(56) References Cited

U.S. PATENT DOCUMENTS

| | | | | |
|---|---|---|---|---|
| 5,377,248 | A * | 12/1994 | Brooks | 377/70 |
| 6,956,518 | B1 * | 10/2005 | Piasecki et al. | 341/166 |
| 7,181,635 | B2 * | 2/2007 | Byrne et al. | 713/323 |
| 7,576,678 | B2 * | 8/2009 | Chatal et al. | 341/163 |
| 7,916,054 | B2 * | 3/2011 | Baker | 341/143 |
| 7,961,131 | B2 * | 6/2011 | Craninckx | 341/172 |
| 7,973,534 | B2 * | 7/2011 | Tatebayashi et al. | 324/433 |
| 8,134,487 | B2 * | 3/2012 | Harpe | 341/163 |
| 8,344,925 | B1 * | 1/2013 | Evans | 341/155 |

* cited by examiner

*Primary Examiner* — Lam T Mai
(74) *Attorney, Agent, or Firm* — Winston Hsu; Scott Margo

(57) ABSTRACT

A method of controlling a successive-comparing-register analog-to-digital convertor (SAR ADC) is provided. Based upon the method, the SAR ADC receives a conversion clock that controls a conversion rate of the SAR ADC.

20 Claims, 9 Drawing Sheets

SUCCESSIVE-APPROXIMATION-REGISTER ANALOG-TO-DIGITAL CONVERTOR AND RELATED CONTROLLING METHOD

CROSS REFERENCE TO RELATED APPLICATIONS

This application claims the benefit of U.S. Provisional Application No. 61/551,027, filed on Oct. 25, 2011 and incorporated herein by reference.

BACKGROUND

1. Technical Field

The invention relates generally to analog-to-digital convertor (ADC), and more particularly, to successive-approximation-register (SAR) ADC.

2. Related Art

A SAR ADC is a type of ADC that applies the binary search algorithm to analog-to-digital conversion. The SAR ADC's conversion rate is generally controlled by a conversion clock that is provided externally. Within each period of the conversion clock, the SAR ADC must sample an analog input and generate a corresponding digital output bit-by-bit, from the most significant bit (MSB) to the least significant bit (LSB).

In order to function properly, the SAR ADC may additionally require a fast clock with a rate much higher than that of the conversion clock. Alternatively, the SAR ADC may additionally require an unbalanced clock with an unbalanced duty cycle. For example, the unbalanced clock's frequency is the same as that of the conversion clock, but the unbalanced clock's duty cycle may be either 20%, 25%, or 40%. However, the unbalanced clock's duty cycle cannot be fine-tuned adaptively.

Either of these two additional requirements may increase the costs of the SAR ADC and make the SAR ADC less favorable. Furthermore, the fact that the unbalanced clock's duty cycle cannot be fine-tuned adaptively sometimes prohibits the SAR ADC from operating in the optimum condition.

SUMMARY

A first embodiment of the invention provides a method of controlling a SAR ADC. A conversion clock that controls a conversion rate of the SAR ADC is received. A first edge of the conversion clock is used to control both the termination timing of a first sampling phase of the SAR ADC and the initiation timing of a second sampling phase of the SAR ADC.

A second embodiment of the invention provides a method of controlling a SAR ADC. A first comparing phase of the SAR ADC is initiated. Then, a first sampling phase of the SAR ADC is initiated in response to the completion of a last task of the first comparing phase.

A third embodiment of the invention provides a method of controlling a SAR ADC. A comparing phase of the SAR ADC is initiated in response to a first edge of a conversion clock. Then, a sampling phase of the SAR ADC is initiated in response to the later one in time domain of the completion of a last task of the comparing phase and a second edge of the conversion clock. The conversion clock controls a conversion rate of the SAR ADC, and the first edge is prior to the second edge.

A fourth embodiment of the invention provides a SAR ADC. The SAR ADC includes a sampling and comparing module, and a clock generator. The sampling and comparing module is configured to convert an analog input into a digital output through successive approximations. The clock generator is coupled to the sampling and comparing module and is configured to: use a first edge of a conversion clock to control both a termination timing of a first sampling phase of the sampling and comparing module and an initiation timing of a second sampling phase of the sampling and comparing module. Wherein the conversion clock controls a conversion rate of the SAR ADC.

A fifth embodiment of the invention provides a SAR ADC. The SAR ADC includes a sampling and comparing module, and a clock generator. The sampling and comparing module is configured to convert an analog input into a digital output through successive approximations. The clock generator is coupled to the sampling and comparing module and is configured to: initiate a comparing phase of the sampling and comparing module in response to a first edge of a conversion clock; and initiate a sampling phase of the SAR ADC in response to a later one in time domain of a completion of a last task of the comparing phase and a second edge of the conversion clock. Wherein the conversion clock controls a conversion rate of the SAR ADC, and the second edge is subsequent to the first edge.

Other features of the present invention will be apparent from the accompanying drawings and from the detailed description which follows.

BRIEF DESCRIPTION OF THE DRAWINGS

The invention is fully illustrated by the subsequent detailed description and the accompanying drawings, in which like references indicate similar elements.

DETAILED DESCRIPTION

Figure 1:
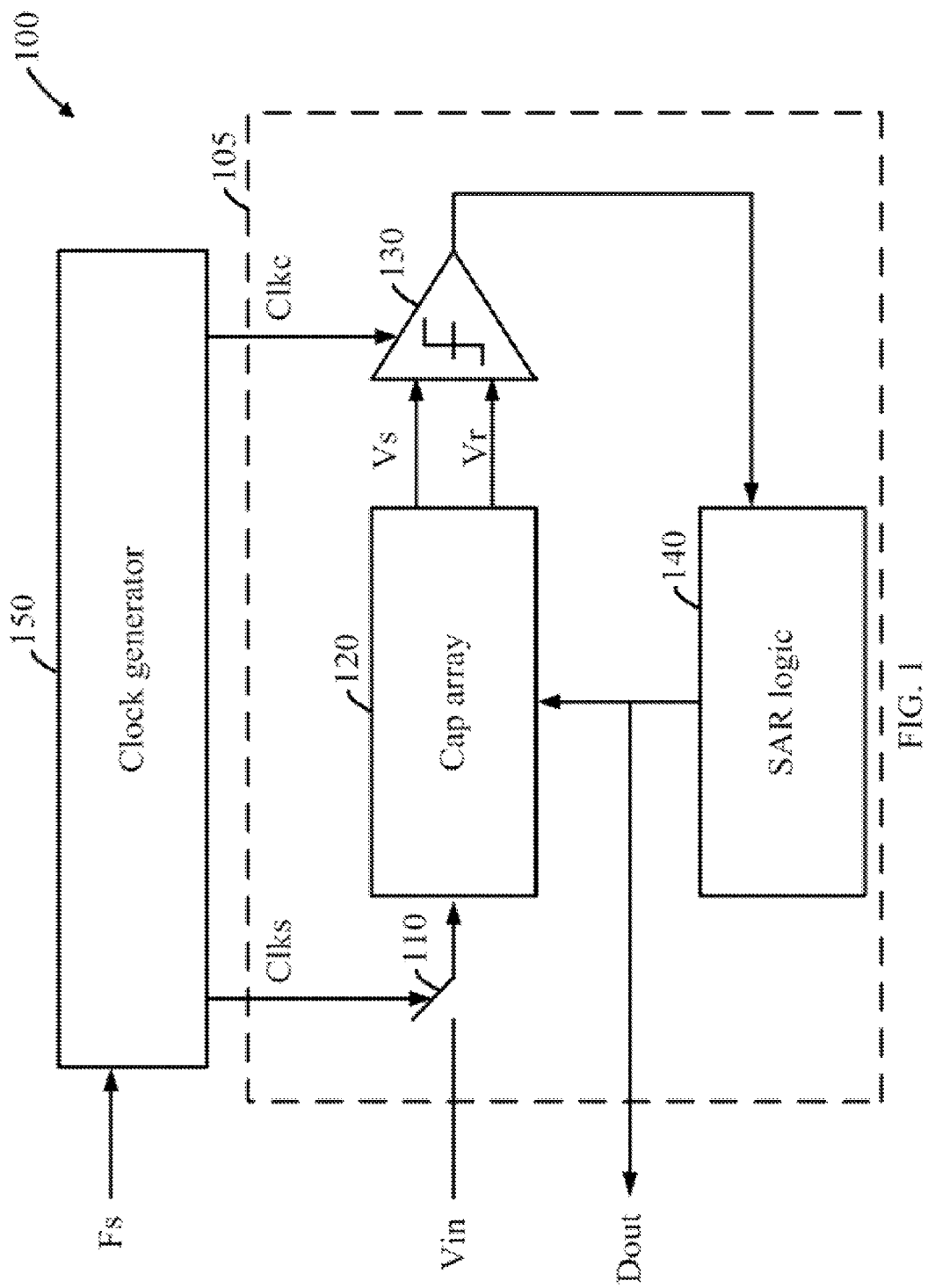
FIG. 1 shows a simplified block diagram of a SAR ADC according to an embodiment of the invention.

FIG. 1 shows a simplified block diagram of a SAR ADC 100 according to an embodiment of the invention. In order to convert an analog input Vin into a digital output Dout, this SAR ADC 100 includes a switch 110, a capacitor array (cap array) 120, a comparator 130, a SAR logic 140, and a clock generator 150. The first four of these five components may be collectively referred to as a sampling and comparing module 105. In addition to receiving the analog input Vin, the SAR ADC 100 also receives a conversion clock Fs that controls the SAR ADC 100's conversion rate.

Within each period of the conversion clock Fs, the SAR ADC 100 has a sampling phase and a comparing phase. In each sampling phase, the switch 110 and the capacitor array 120 samples and holds the analog input Vin once and provides a sampled voltage Vs to the comparator 130. In each comparing phase, with the help of the capacitor array 120 and the comparator 130, the SAR logic 140 generates one digital value of the output Dout bit-by-bit, from the MSB to the LSB. The clock generator 150 generates a sampling clock Clks to control the alternation timings of the sets of sampling phases and comparing phases of the SAR ADC 100. In addition to the sampling clock Clks, the clock generator 150 also generates a comparing control signal Clkc to control the SAR ADC 100's operation in the comparing phases. Under the control of the clock generator 150, the duty cycle of the sampling clock Clks is variable and can be fine-tuned adaptively and automatically to help the SAR ADC 100 operate in the optimum condition.

In addition to providing the sampled voltage Vs based on the analog input Vin, the capacitor array 120 also serves as a digital-to-analog convertor (DAC) that converts the digital output Dout, whether finalized or not, into a reference voltage Vr. Each time the comparator 130 compares the sampled voltage Vs with the reference voltage Vr, the SAR logic 140 can generate one more bit for a digital value of the digital output Dout, until the LSB of the digital value is generated.

The conversion clock Fs has alternate first and second edges, and its duty cycle is, e.g., 50%. To avoid confusion, in the disclosed embodiments, falling and rising edges are first and second edges, respectively. Furthermore, in the disclosed embodiments, the SAR ADC 100 is in a sampling phase when the sampling clock Clks is at a first state and in the comparing phase when the sampling clock Clks is at a second state. The first state may be one of a high state and a low state, and the second state may be the other of the high state and the low state.

Figure 2:
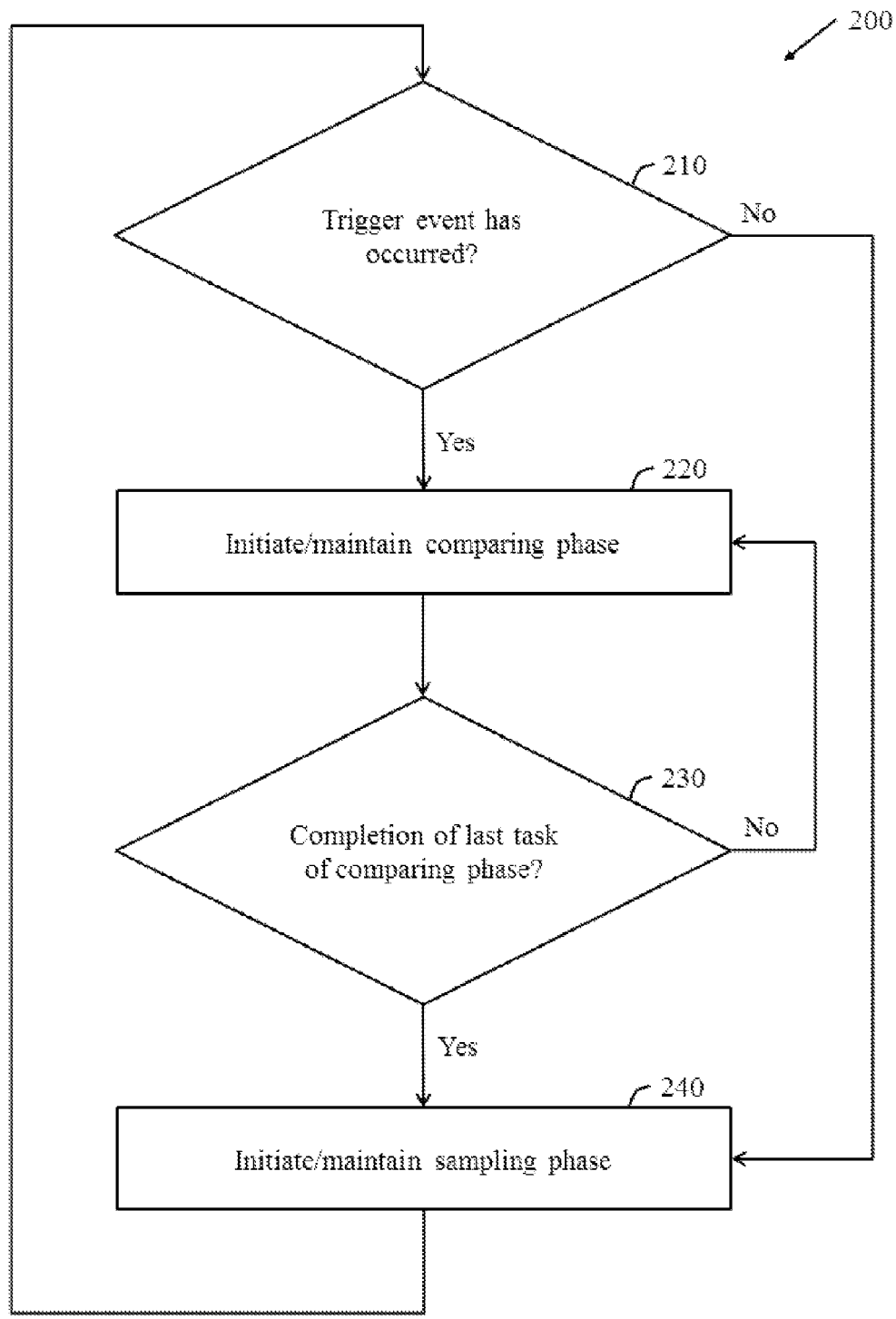
FIG. 2 shows a simplified flowchart of an exemplary process performed by the clock generator of FIG. 1.

FIG. 2 shows a simplified flowchart of an exemplary process 200 performed by the clock generator 150 in controlling the alternation timings of the sets of sampling phases and comparing phases of the SAR ADC 100. The flowchart is simplified in that it includes only the steps that help the understanding of the invention; some other steps are omitted from FIG. 2 to avoid distraction. For example, receiving the conversion clock Fs from an external circuit is a step performed by the clock generator 150 but not depicted in FIG. 2.

The clock generator 150 performs step 210 when the SAR ADC 100 is in a sampling phase. At step 210, the clock generator 150 determines whether a trigger event has occurred. If the trigger event occurs, the clock generator 150 enters step 220; otherwise, the clock generator 150 returns to step 240 and keeps the sampling clock Clks at the high state to maintain the SAR ADC 100 in the sampling phase. For example, the trigger event may be the reception of a falling edge of the conversion clock Fs.

When the clock generator 150 leaves step 210 and enters step 220, it terminates the sampling phase and initiates a comparing phase by switching the sampling clock Clks to the low state. Furthermore, the clock generator 150 generates N comparing pulses successively on the comparing control signal Clkc to help the SAR ADC 100 complete N tasks in the comparing phase. For example, a task may be the generation of a bit of the digital output Dout. If the digital output Dout is M-bit long, N should be equal to or larger than M. The clock generator 150 can include an oscillator, such as a ring oscillator, that generates the N comparing pulses successively on the comparing control signal Clkc in response to the trigger event. Based on information provided by the comparator 130 or the SAR logic 140, the clock generator 150 may retain a signal Clk_n in an internal register to keep track of the status of the nth task of the comparing phase, where n is an integer between 1 and N. For example, a high state of the signal Clk_1 may mean that the sampling and comparing module 105 has generated the MSB of a digital value of the digital output Dout, and a subsequent low state of the signal Clk_1 may mean that the sampling and comparing module 105 is ready to generate or is generating the MSB of a next digital value of the digital output Dout. Similarly, when N is equal to M, a high state of the signal Clk_N may mean that the sampling and comparing module 105 has generated the LSB of a digital value of the digital output Dout, and a subsequent low state of the signal Clk_1 may mean that the sampling and comparing module 105 is ready to generate or is generating the LSB for a next digital value of the digital output Dout. Based on information provided by the comparator 130 or the clock generator 150, the SAR logic 140 may also use its internal registers to keep track of the statuses of the tasks of the comparing phase.

The clock generator 150 performs step 230 when the SAR ADC 100 is in a comparing phase. Specifically, at step 230, the clock generator 150 determines whether the sampling and comparing module 105 has completed a last task of the comparing phase. If the last task has been completed, the clock generator 150 enters step 240; otherwise, the clock generator 150 returns to step 220 and keeps the sampling clock Clks at the low state to maintain the SAR ADC 100 in the comparing phase.

When the clock generator 150 leaves step 230 and enters step 240, it terminates the comparing phase and initiates a next sampling phase by switching the sampling clock Clks to the high state. For example, if the clock generator 150 determines that the signal Clk_N has been raised to indicate the completion of the last task, the clock generator 150 may enter step 240 by switching the sampling clock Clks to the high state. Furthermore, whenever the clock generator 150 leaves step 230 and enters step 240, the SAR ADC 100 may send a completed/settled digital value of the digital output Dout to a subsequent circuit served by the SAR ADC 100.

If the trigger event is a falling edge of the conversion clock Fs, the clock generator 150 in effect uses the single falling edge to directly control the termination timing of a sampling phase and the initiation timing of a comparing phase and indirectly control the initiation timing of a next sampling phase. Specifically, because the falling edge triggers the comparing phase and the next sampling phase starts when the last task of the comparing phase is completed, the falling edge in effect controls the initiation timing of the next sampling phase indirectly. In contrast, the clock generator 150 may neglect the rising edges of the conversion clock Fs and does not use them to control the alternation timings of the SAR ADC 100's sets of sampling phases and comparing phases. As a result, the initiation and termination timings of the sets of sampling phases and comparing phases of the SAR ADC 100 are asynchronous with respect to the rising edges of the conversion clock Fs.

Figure 3:
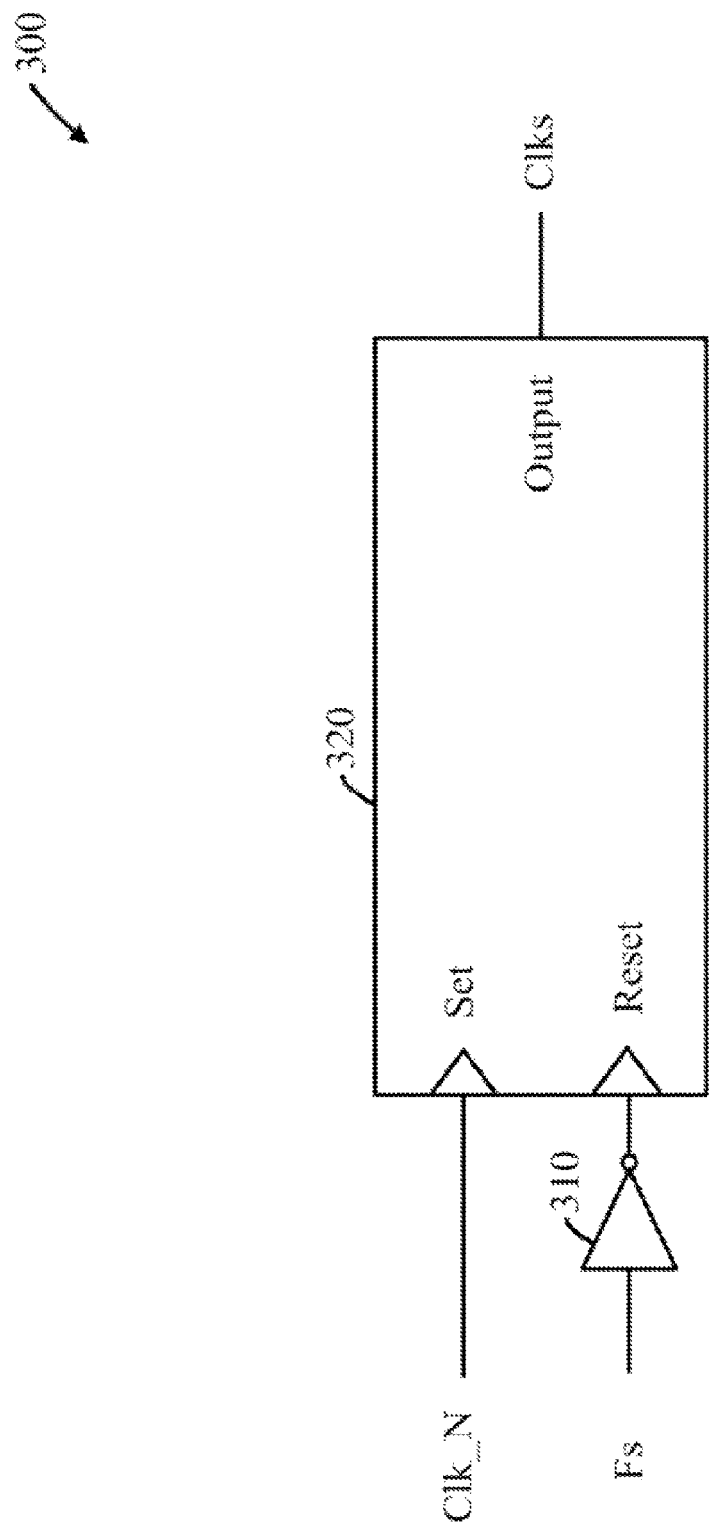
FIG. 3 shows a simplified block diagram of an exemplary logic circuit of the clock generator of FIG. 1 for implementing the process of FIG. 2.

To implement process 200, the clock generator 150 may include a logic circuit 300 shown in FIG. 3 to generate the sampling clock Clks according to the signal Clk_N and the conversion clock Fs. The logic circuit 300 includes a NOT logic 310 and a Set-Reset logic 320. The Set-Reset logic 320 may switch the sampling clock Clks, e.g. to a high state, whenever it receives a rising edge of the signal Clk_N, and switch the sampling clock Clks, e.g. to a low state, whenever it receives a falling edge of the conversion clock Fs.

One of the characteristics of process 200 is that it allows the duty cycle of the sampling clock Clks to vary and be fine-tuned adaptively and automatically. Generally speaking, the time length required by each comparing phase is affected by the manufacturing process of the SAR ADC 100 and the condition (such as temperature) under which the SAR ADC 100 operates, but may not be adjusted freely. Instead of giving each sampling phase a fixed percentage (or one of a few fixed percentages) of a period of the conversion clock Fs, process 200 gives the sampling phase a variable duration that is the maximum available under the circumstances. Specifically, in each period of the conversion clock Fs, the clock generator 150 first allows a comparing phase to take up whatever is required to complete all the tasks in the phase, and then leaves all the remaining time to a subsequent sampling phase. As a result, the switch 110 and the capacitor array 120 may always get the maximum amount of available time under the circumstances to sample the analog input Vin properly.

Figure 4:
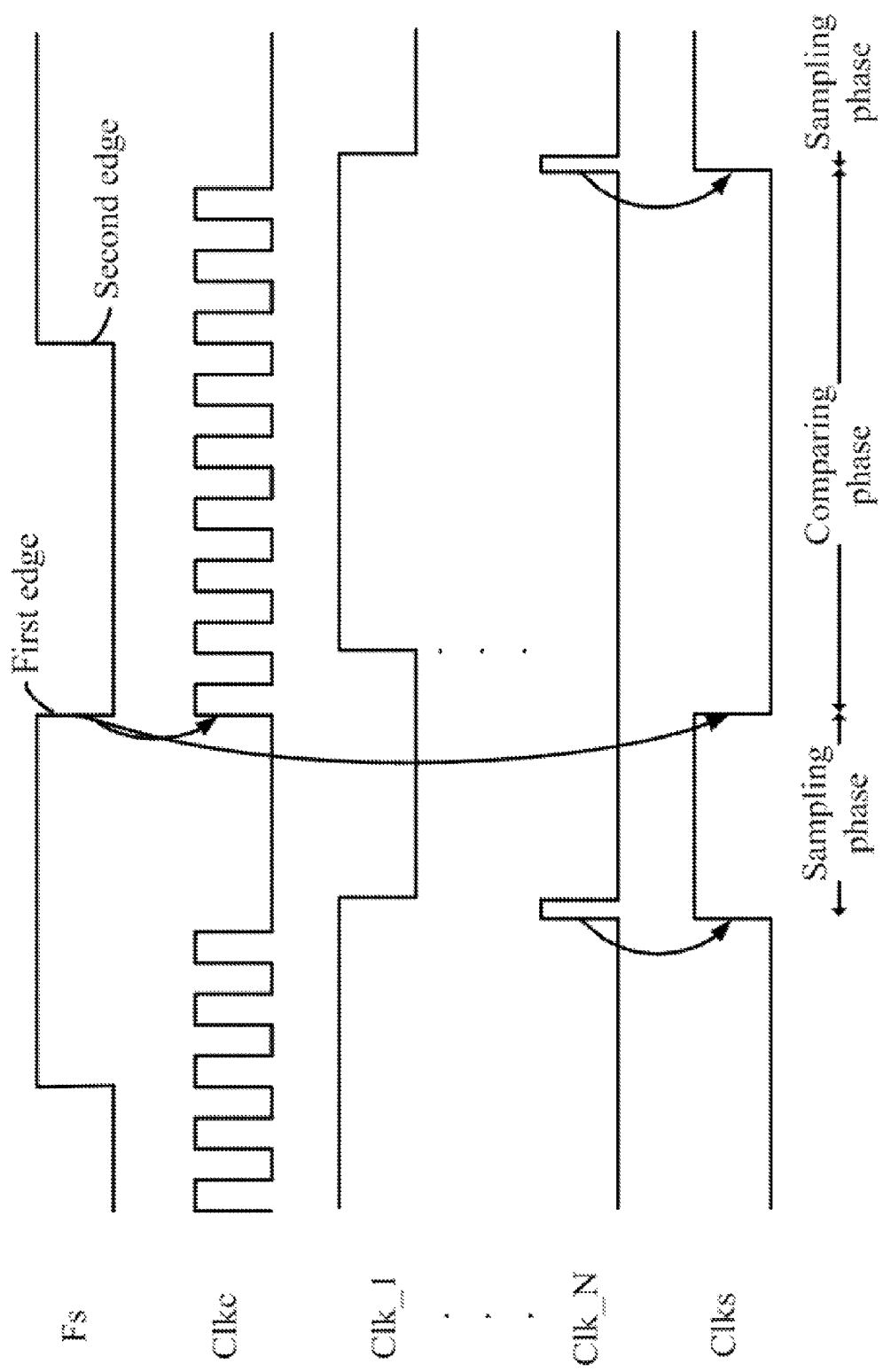
FIG. 4 and FIG. 5 show two timing diagrams illustrating the operations of the SAR ADC of FIG. 1 in performing the process of FIG. 2.
Figure 5:
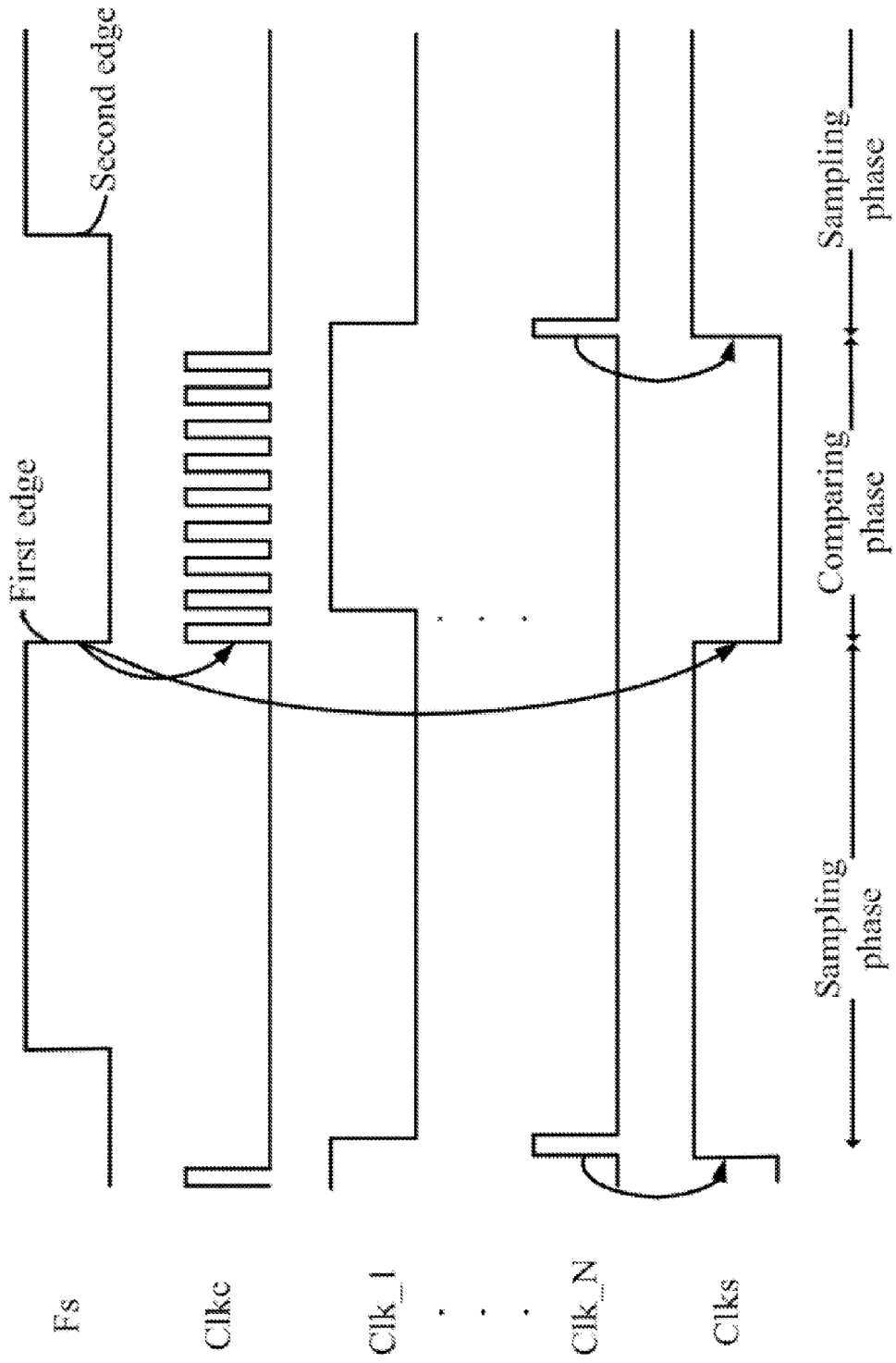

FIG. 4 and FIG. 5 show two timing diagrams illustrating the operations of the SAR ADC 100 of FIG. 1 in performing process 200 of FIG. 2. In FIG. 4, the comparing pulses on the comparing control signal Clkc are relatively longer pulses because, e.g., the SAR ADC 100 is manufactured at the slow-slow process corner. As a result, the clock generator 150 allows each comparing phase to be relatively longer. Furthermore, the clock generator 150 automatically leaves a relatively shorter period of time to each sampling phase. In FIG. 5, the comparing pulses on the comparing control signal Clkc are relatively shorter pulses because, e.g., the SAR ADC 100 is manufactured at the fast-fast process corner. As a result, the clock generator 150 allows each comparing phase to be relatively shorter. Furthermore, the clock generator 150 automatically leaves a relatively longer period of time to each sampling phase.

In contrast, a conventional SAR ADC frequently cannot fine-tune the time lengths of its sampling phases adaptively. Generally speaking, the sampling phases' durations are not affected by the variation of actual time required to complete all the tasks in each of the SAR ADCs comparing phases. Instead, to ensure proper operation, the conventional SAR ADC frequently allocates excessive time to each comparing phase. As a result, each sampling phase seldom gets the maximum time available under the circumstances.

Figure 6:
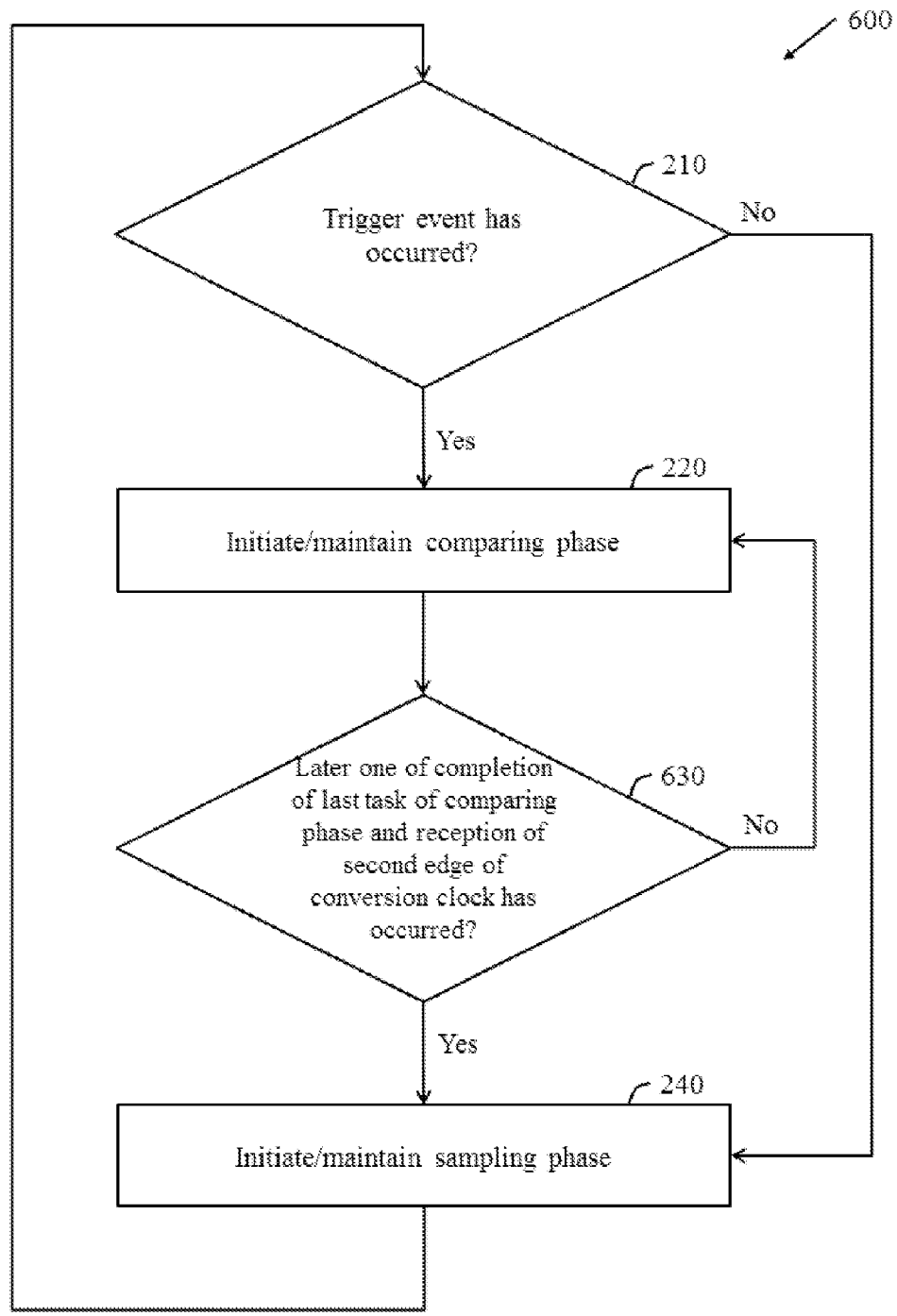
FIG. 6 shows a simplified flowchart of another exemplary process performed by the clock generator of FIG. 1.

FIG. 6 shows a simplified flowchart of an exemplary process 600 performed by the clock generator 150 in controlling the operation of the SAR ADC 100. Process 600 is generally the same as process 200 except for that in process 600, step 230 is replaced by step 630. The clock generator 150 performs step 630 when the SAR ADC 100 is in a comparing phase. At step 630, the clock generator 150 determines whether a last task of the comparing phase has been completed and whether a rising edge of the conversion clock Fs has been received. If the later one in time domain of these two conditions occurs, the clock generator 150 enters step 240; otherwise, the clock generator 150 returns to step 220 and keeps the sampling clock Clks at the low state to maintain the SAR ADC 100 in the comparing phase.

When the clock generator 150 leaves step 630 and enters step 240, it terminates the comparing phase and initiates a next sampling phase by switching the sampling clock Clks to the high state. Furthermore, whenever the clock generator 150 leaves step 630 and enters step 240, the SAR ADC 100 may send a completed/settled digital value of the digital output Dout to a subsequent circuit served by the SAR ADC 100.

If the trigger event in processes 600 and 200 is the reception of a falling edge of the conversion clock Fs, and the conversion clock Fs has a duty cycle of 50%, then process 600 is different from process 200 in that the former allows a sampling phase to use up to 50% of a period of the conversion clock Fs. Specifically, under process 600, if it takes the SAR ADC 100 less than 0.5 period of the conversion clock Fs to complete all the tasks of a comparing phase, the clock generator 150 will simply let both the comparing phase and a subsequent sampling phase to last 0.5 period of the conversion clock Fs. If it takes the SAR ADC 100 more than 0.5 period of the conversion clock Fs to complete all the tasks of a comparing phase, the clock generator will allow the comparing phase to last longer than 0.5 period of the conversion clock Fs, and leave the remaining time (which is less than 0.5 period of the conversion clock Fs) to a subsequent sampling phase. In addition to allowing the time length of each sampling phase to be fine-tuned automatically (at least to some extent), process 600 is further advantageous in that it allows the clock generator 150 to have a simpler circuit structure and a lower cost.

Figure 7:
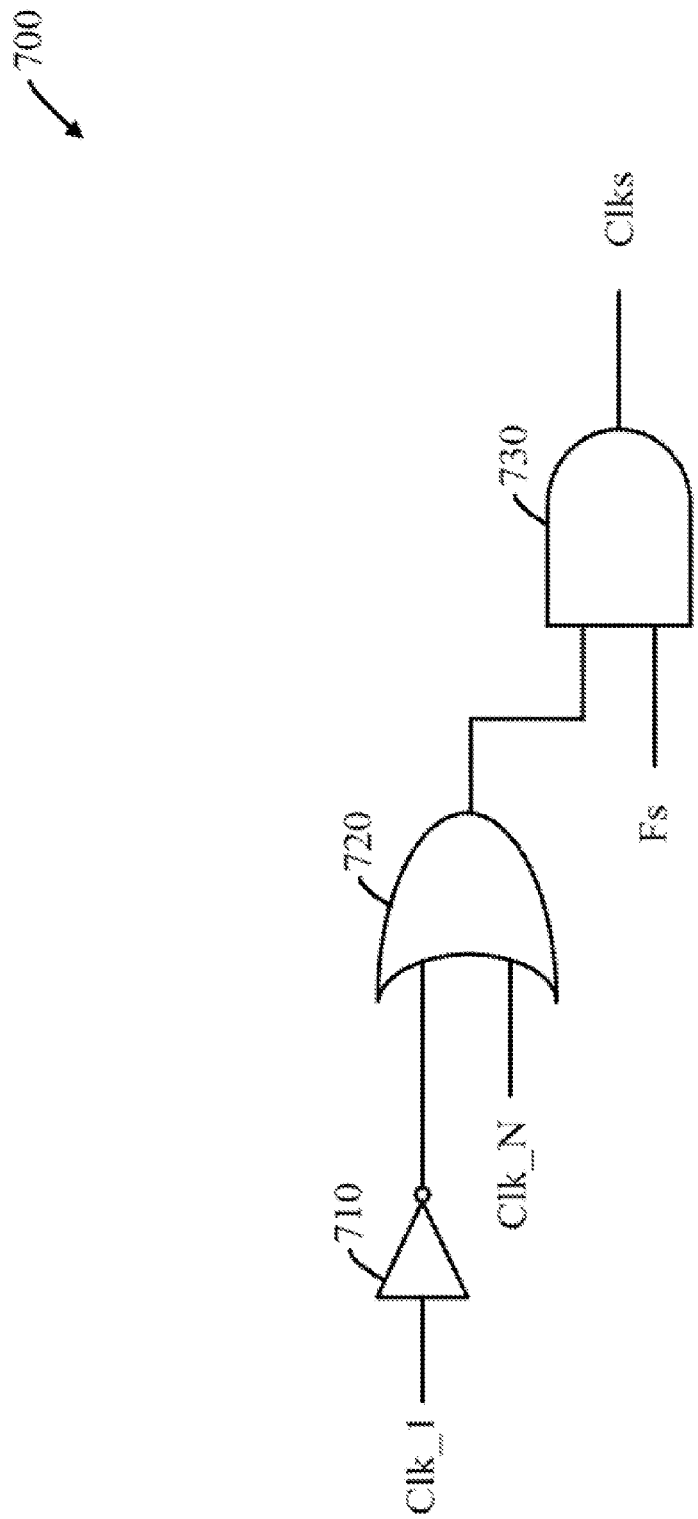
FIG. 7 shows a simplified block diagram of an exemplary logic circuit of the clock generator of FIG. 1 for implementing the process of FIG. 6.

To implement process 600, the clock generator 150 may include a logic circuit 700 shown in FIG. 7 to generate the sampling clock Clks based on the signal Clk_1, the signal Clk_N, and the conversion clock Fs. The logic circuit 700 includes a NOT logic 710, an OR logic 720, and an AND logic 730. This logic circuit 700 is simpler and costs less than the real implementation of the logic circuit 300 shown in FIG. 3.

Figure 8:
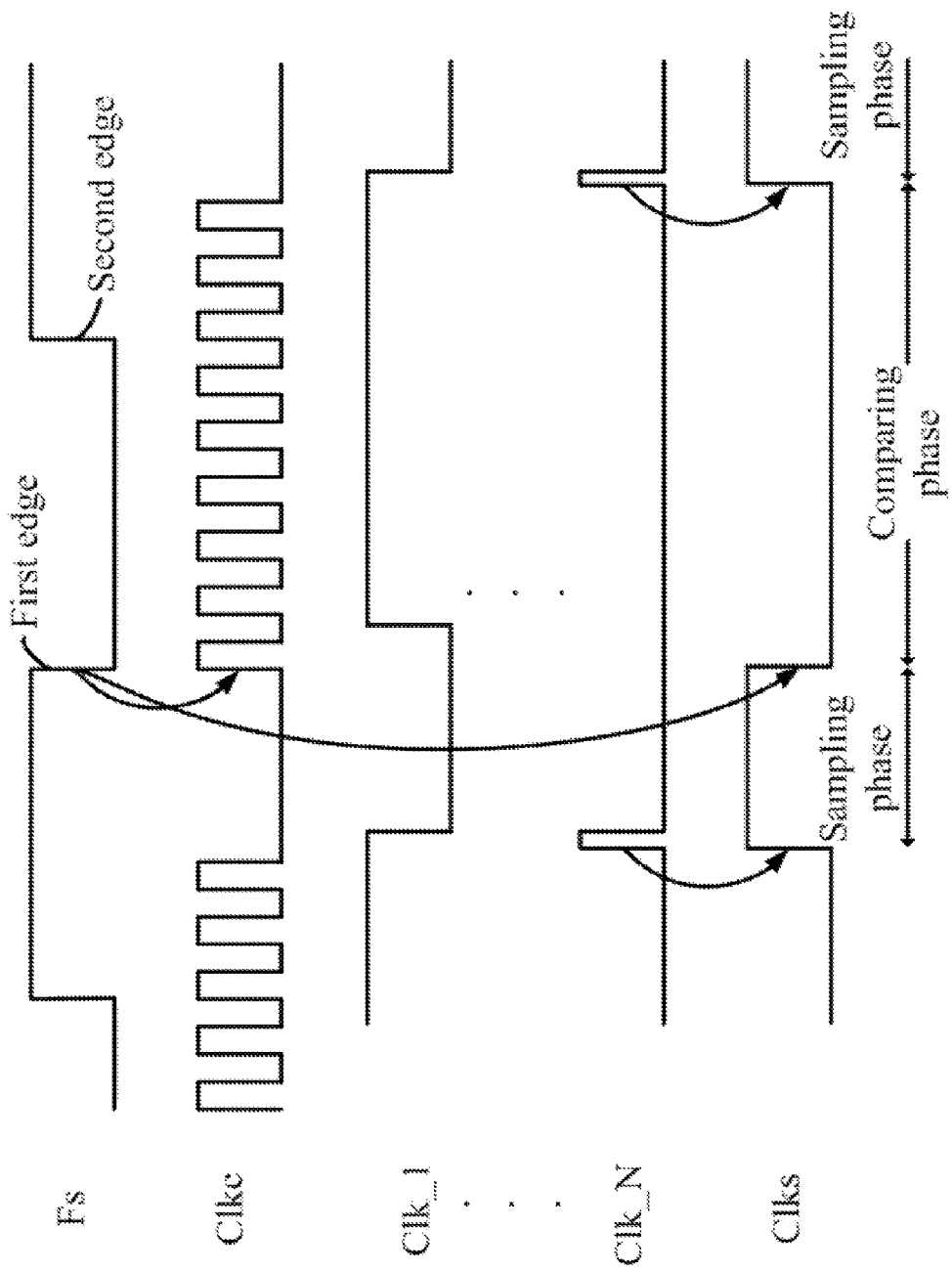
FIG. 8 and FIG. 9 show two timing diagrams illustrating the operations of the SAR ADC of FIG. 1 in performing the process of FIG. 6.
Figure 9:
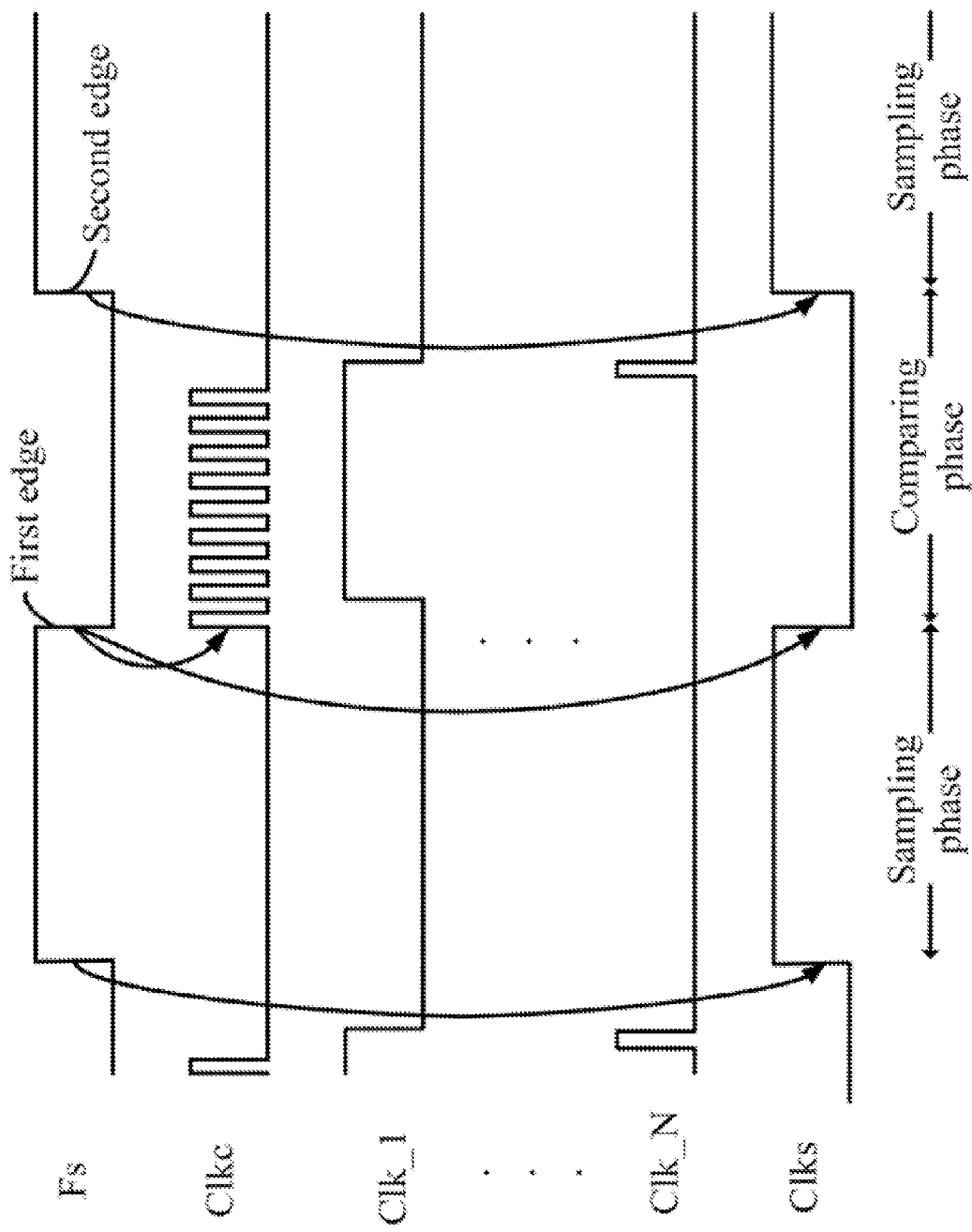

FIG. 8 and FIG. 9 show two timing diagrams illustrating the operations of the SAR ADC 100 of FIG. 1 in performing process 600 of FIG. 6. In these two examples, it's assumed that the conversion clock Fs has a duty cycle of 50%. In FIG. 8, the comparing pulses on the comparing control signal Clkc are relatively longer pulses because, e.g., the SAR ADC 100 is manufactured at the slow-slow process corner. As a result, the clock generator 150 allows each comparing phase to be relatively longer. Moreover, the clock generator 150 automatically leaves a relatively shorter period of time to each sampling phase. In FIG. 9, the comparing pulses on the comparing control signal Clkc are relatively shorter pulses because, e.g., the SAR ADC 100 is manufactured at the fast-fast process corner. Under the circumstances, the clock generator 150 automatically gives each sampling phase and each comparing phase 0.5 period of the conversion clock Fs. Please note that in FIG. 9, a comparing phase of the SAR ADC 100 does not terminate at the moment when a last task of the comparing phase is completed. Instead, the comparing phase of the SAR ADC 100 ends when the clock generator 150 receives a rising edge of the conversion clock Fs.

In the foregoing detailed description, the invention has been described with reference to specific exemplary embodiments thereof. It will be evident that various modifications may be made thereto without departing from the spirit and scope of the invention as set forth in the following claims. The detailed description and drawings are, accordingly, to be regarded in an illustrative sense rather than a restrictive sense.

What is claimed is:

1. A method of controlling a successive-approximation-register analog-to-digital convertor (SAR ADC), the method comprising:
   receiving a conversion clock that controls a conversion rate of the SAR ADC; and
   using a first edge of the conversion clock to control both a termination timing of a first sampling phase of the SAR ADC and an initiation timing of a second sampling phase of the SAR ADC.

2. The method of claim 1, wherein the step of using the first edge comprises:
   terminating the first sampling phase and initiating a first comparing phase of the SAR ADC in response to the first edge; and
   initiating the second sampling phase in response to a completion of a last task of the first comparing phase.

3. The method of claim 2, wherein the last task of the first comparing phase comprises a generation of a least significant bit.

4. The method of claim 1, wherein the initiation timing of the second sampling phase is irrelevant to a timing of a second edge of the conversion clock, and the second edge is subsequent to the first edge of the conversion clock.

5. The method of claim 4, wherein the first edge is one of a rising edge and a falling edge of the conversion clock, and the second edge is the other of the rising edge and falling edge of the conversion clock.

6. The method of claim 2, further comprising:
initiating a second comparing phase of the SAR ADC in response to another first edge of the conversion clock; and
initiating a third sampling phase of the SAR ADC in response to a later one in time domain of a completion of a last task of the second comparing phase and another second edge of the conversion clock, wherein the another second edge is subsequent to the another first edge.

7. A method of controlling a successive-approximation-register analog-to-digital convertor (SAR ADC), the method comprising:
initiating a first comparing phase of the SAR ADC; and
initiating a first sampling phase of the SAR ADC in response to a completion of a last task of the first comparing phase.

8. The method of claim 7, wherein the step of initiating the first comparing phase comprises:
initiating the first comparing phase in response to a first edge of a conversion clock;
wherein the conversion clock controls a conversion rate of the SAR ADC.

9. The method of claim 8, wherein the first sampling phase is initiated at an initiation timing, and the initiation timing of the first sampling phase is irrelevant to a timing of a second edge of the conversion clock, and the second edge is subsequent to the first edge of the conversion clock.

10. The method of claim 9, wherein the first edge is one of a rising edge and a falling edge of the conversion clock, and the second edge is the other of the rising edge and falling edge of the conversion clock.

11. The method of claim 9, further comprising:
initiating a second comparing phase of the SAR ADC in response to another first edge of the conversion clock; and
initiating a second sampling phase of the SAR ADC in response to a later one in time domain of a completion of a last task of the second comparing phase and another second edge of the conversion clock, wherein the another second edge is subsequent to the another first edge.

12. The method of claim 7, wherein the last task of the first comparing phase comprises a generation of a least significant bit.

13. A method of controlling a successive-approximation-register analog-to-digital convertor (SAR ADC), the method comprising:
initiating a comparing phase of the SAR ADC in response to a first edge of a conversion clock; and
initiating a sampling phase of the SAR ADC in response to a later one in time domain of a completion of a last task of the comparing phase and a second edge of the conversion clock;
wherein the conversion clock controls a conversion rate of the SAR ADC, and the second edge is subsequent to the first edge.

14. The method of claim 13, wherein the first edge is one of a rising edge and a falling edge of the conversion clock, and the second edge is the other of the rising edge and falling edge of the conversion clock.

15. The method of claim 13, wherein the last task of the comparing phase comprises a generation of a least significant bit.

16. A successive-approximation-register analog-to-digital convertor (SAR ADC), comprising:
a sampling and comparing module, configured to convert an analog input into a digital output through successive approximations; and
a clock generator, coupled to the sampling and comparing module, configured to:
use a first edge of a conversion clock to control both a termination timing of a first sampling phase of the sampling and comparing module and an initiation timing of a second sampling phase of the sampling and comparing module;
wherein the conversion clock controls a conversion rate of the SAR ADC.

17. The SAR ADC of claim 16, wherein the clock generator comprises:
a logic circuit, configured to:
switch a sampling clock from a first state to a second state in response to the first edge of the conversion clock; and
switch the sampling clock from the second state to the first state in response to a completion of a last task of a first comparing phase of the sampling and comparing module;
wherein the first comparing phase is subsequent to the first sampling phase and prior to the second sampling phase, and the sampling clock controls phase alternation timings of the sampling and comparing module.

18. The SAR ADC of claim 17, wherein the last task of the first comparing phase comprises a generation of a least significant bit.

19. A successive-approximation-register analog-to-digital convertor (SAR ADC), comprising:
a sampling and comparing module, configured to convert an analog input into a digital output through successive approximations; and
a clock generator, coupled to the sampling and comparing module, configured to:
initiate a comparing phase of the sampling and comparing module in response to a first edge of a conversion clock; and
initiate a sampling phase of the SAR ADC in response to a later one in time domain of a completion of a last task of the comparing phase and a second edge of the conversion clock;
wherein the conversion clock controls a conversion rate of the SAR ADC, and the second edge is subsequent to the first edge.

20. The SAR ADC of claim 19, wherein the last task of the comparing phase comprises a generation of a least significant bit.

* * * * *